(12) United States Patent
Nam

(10) Patent No.: US 6,654,310 B2
(45) Date of Patent: Nov. 25, 2003

(54) SEMICONDUCTOR MEMORY DEVICE WITH AN ADAPTIVE OUTPUT DRIVER

(75) Inventor: Ki-Jun Nam, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/197,539

(22) Filed: Jul. 18, 2002

(65) Prior Publication Data

US 2003/0058732 A1 Mar. 27, 2003

(30) Foreign Application Priority Data

Sep. 24, 2001 (KR) ........................................ 2001-58972

(51) Int. Cl.[7] .................................................. G11C 8/00
(52) U.S. Cl. ............................ 365/230.06; 365/189.07; 365/189.11; 365/230.08
(58) Field of Search ..................... 365/230.08, 230.06, 365/189.11, 210, 240, 189.08, 189.09, 189.07, 189.05

(56) References Cited

U.S. PATENT DOCUMENTS

| | | |
|---|---|---|
| 5,402,389 A | 3/1995 | Flannagan et al. |
| 5,410,263 A | 4/1995 | Waizman |
| 5,600,266 A | 2/1997 | Terrell et al. |
| 5,740,115 A | 4/1998 | Ishibashi et al. |
| 5,930,197 A | 7/1999 | Ishibashi et al. |
| 5,977,796 A | 11/1999 | Gabara |
| 6,034,916 A | 3/2000 | Lee |
| 6,058,059 A | 5/2000 | Huang et al. |
| 6,064,230 A | 5/2000 | Singh |
| 6,087,853 A | 7/2000 | Huber et al. |
| 6,118,310 A | 9/2000 | Esch, Jr. |

FOREIGN PATENT DOCUMENTS

| | | | |
|---|---|---|---|
| JP | 05-002893 | 1/1993 | ......... G11C/11/417 |
| JP | 07-115351 | 5/1995 | ............ H03K/5/13 |
| JP | 07-312088 | 11/1995 | ......... G11C/11/413 |
| JP | 08-031180 | 2/1996 | ......... G11C/11/413 |

Primary Examiner—Michael S. Lebentritt
Assistant Examiner—Hien Nguyen
(74) Attorney, Agent, or Firm—Jacobson Holman PLLC

(57) ABSTRACT

A semiconductor memory device employs an adaptive output driver to vary the strength of the output driver with the variation in external voltage and temperature. For this purpose, the semiconductor memory device with the adaptive output driver includes a shift register unit for producing a control signal so as to control the voltage level of the adaptive output driver, a data masking buffer for generating a reference voltage to be compared with the voltage level of the adaptive output driver, an adaptive output driver for varying its strength in response to the control signal provided from the shift register unit, and a comparator for comparing the reference voltage with the voltage level of the adaptive output driver to thereby generate a signal determining whether or not the shift register unit should perform a shift operation.

11 Claims, 9 Drawing Sheets

SEMICONDUCTOR MEMORY DEVICE WITH AN ADAPTIVE OUTPUT DRIVER

FIELD OF THE INVENTION

The present invention relates to semiconductor memory devices and, more particularly, to a semiconductor memory device with an adaptive output driver capable of varying its strength according to the variation in voltage and temperature.

BACKGROUND OF THE INVENTION

An output driver plays a role as an interface between a DRAM and its external devices in a reading operation. Therefore, the DC and AC characteristics of the output driver must be stable with varying voltage, temperature and manufacturing processes. In particular, this stability is keenly required in high-speed operational devices. First of all, the DC characteristics, represented by IBIS (input/output buffer information specification), IOH (output high current), IOL (output low current) and so on, limit the impedance of the output driver to a given range over the entire voltage range. However, if there is no circuit to compensate the variation in manufacturing processes, voltage and temperature, it is difficult to limit the impedance of the output driver to the given range. Further, the AC characteristics of the output driver, such as slew rate or skew between data, vary according to manufacturing processes, voltage and temperature. These parameters have a great influence on a margin to the product specification as well as signal integrity.

In general, there are many types of output drivers; most noticeable are the tri-state CMOS output driver and the open drain output driver. Hereinafter, the former output driver will be described as an example.

FIG. 1A provides a schematic diagram of a conventional tri-state CMOS output driver and FIG. 1B shows a waveform diagram of the internal signals from a conventional output driver.

The output driver connected to a data pin consists of a PMOS transistor MP1 and an NMOS transistor MN1, which are constructed to share an input buffer and a pad. Gates of the PMOS transistor MP1 and the NMOS transistor MN1 are provided with an up signal UP and a down signal DN, respectively.

As shown in FIG. 1B, the up signal UP and the down signal DN output data with waveforms capable of maintaining high impedance at the pad.

Meanwhile, a reference voltage Vref having a voltage level of Vextq/2 is supplied from the outside of a DRAM. A serial termination resistor Rs and a parallel termination resistor Rt which are connected to the pad are attached to a termination voltage Vtt at the outside of the DRAM where the termination voltage Vtt has a voltage level of Vref±0.04 V and is supplied from the outside.

Since a data masking (DM) pin is only used in writing operations, there exists only an input buffer. However, a dummy output driver can be used for the DM pin to match data strobe and loading. The dummy output driver is made of a PMOS transistor MP2 and an NMOS transistor MN2. Gates of the PMOS and NMOS transistors MP2 and MN2 are connected to an external supply voltage Vextq and a ground voltage Vssq, respectively. Thus, the transistors MP2 and MN2 also play a role as diodes.

However, in the above structure, since the strength of the output driver is not variable with the variation in voltage and temperature, the output driver fails to control the variation of current and voltage thereof.

SUMMARY OF THE INVENTION

It is, therefore, a primary object of the present invention to provide a semiconductor memory device employing an adaptive output driver capable of varying its strength according to the variation in external voltage, temperature and so on.

In accordance with the present invention, there is provided a semiconductor memory device with an adaptive output driver, comprising: a control means for producing a control signal to control the voltage level of the adaptive output driver; data masking buffering means for generating a reference voltage to be compared with the voltage level of the adaptive output driver; the adaptive output driver whose strength varies in response to the control signal provided from the control means; and comparison means for comparing the reference voltage with the voltage level of the adaptive output driver to thereby generate a signal determining whether or not the control means should perform a shift operation.

The adaptive output driver includes a plurality of pull-up transistors for pull-up driving an output terminal of the semiconductor memory device in response to the control signal of the shift register unit and a control signal of a pre-driver. It also includes a plurality of pull-down transistors which are connected to the plurality of pull-up transistors in parallel, for pull-down driving the output terminal in response to the control signal of the shift register unit and the control signal of the pre-driver.

In the shift register unit, the plurality of pull-up transistors consist of 4 PMOS transistors, which are turned-on or turned-off in response to the control signal of the shift register unit. Among the 4 PMOS transistors, the number of transistors to be turned-off increases depending on the comparison result of the comparator.

In the shift register unit, the plurality of pull-down transistors consist of 4 NMOS transistors, which are turned-on or turned-off in response to the control signal of the shift register unit. Among the 4 NMOS transistors, the number of transistors to be turned-off increases depending on the comparison result of the comparator.

In the above, the shift register unit includes a pull-up shift register for receiving the signal generated from the comparator to thereby produce a control signal controlling the plurality of pull-up transistors, and a pull-down shift register for receiving the signal produced from the comparator to thereby generate a control signal controlling the plurality of pull-down transistors.

Further, the data masking buffer includes a PMOS transistor group made of a plurality of PMOS transistors serially connected to each other and an NMOS transistor group consisting of a multiplicity of NMOS transistors serially connected to each other, wherein the PMOS transistor group and the NMOS transistor group are attached to each other serially, vertically and symmetrically and a node connecting the PMOS transistor group and the NMOS transistor group is attached to a termination voltage Vtt node. The PMOS transistor group and the NMOS transistor group contain 3 PMOS transistors and 3 NMOS transistors, respectively. Meanwhile, among the PMOS transistor group, a resistor is connected between a gate and a drain of some PMOS transistors and among the NMOS transistor group, a resistor is attached between a gate and a drain of some NMOS transistors.

In accordance with the present invention, the strength of the output driver is changed with respect to the voltage and the temperature by employing a plurality of NMOS transistors and PMOS transistors in the output driver and controlling the number of transistor to be turned-on by using a register. Since the variation of the reference voltage Vrefn for the termination voltage Vtt according to the temperature variation of −10° C. to 90° C. is very small, it is possible to accurately control the temperature compensation in an operational range and vary the size of the output driver according to the variation of the temperature and the voltage. For example, if the external voltage becomes higher, the shift operation of the shift register is performed in the direction of decreasing overall strength by reducing the size of the output driver. On the other hand, if the external voltage becomes lower, the shift operation of the shift register is executed in the direction of increasing overall strength by increasing the size of the output driver.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 1A:
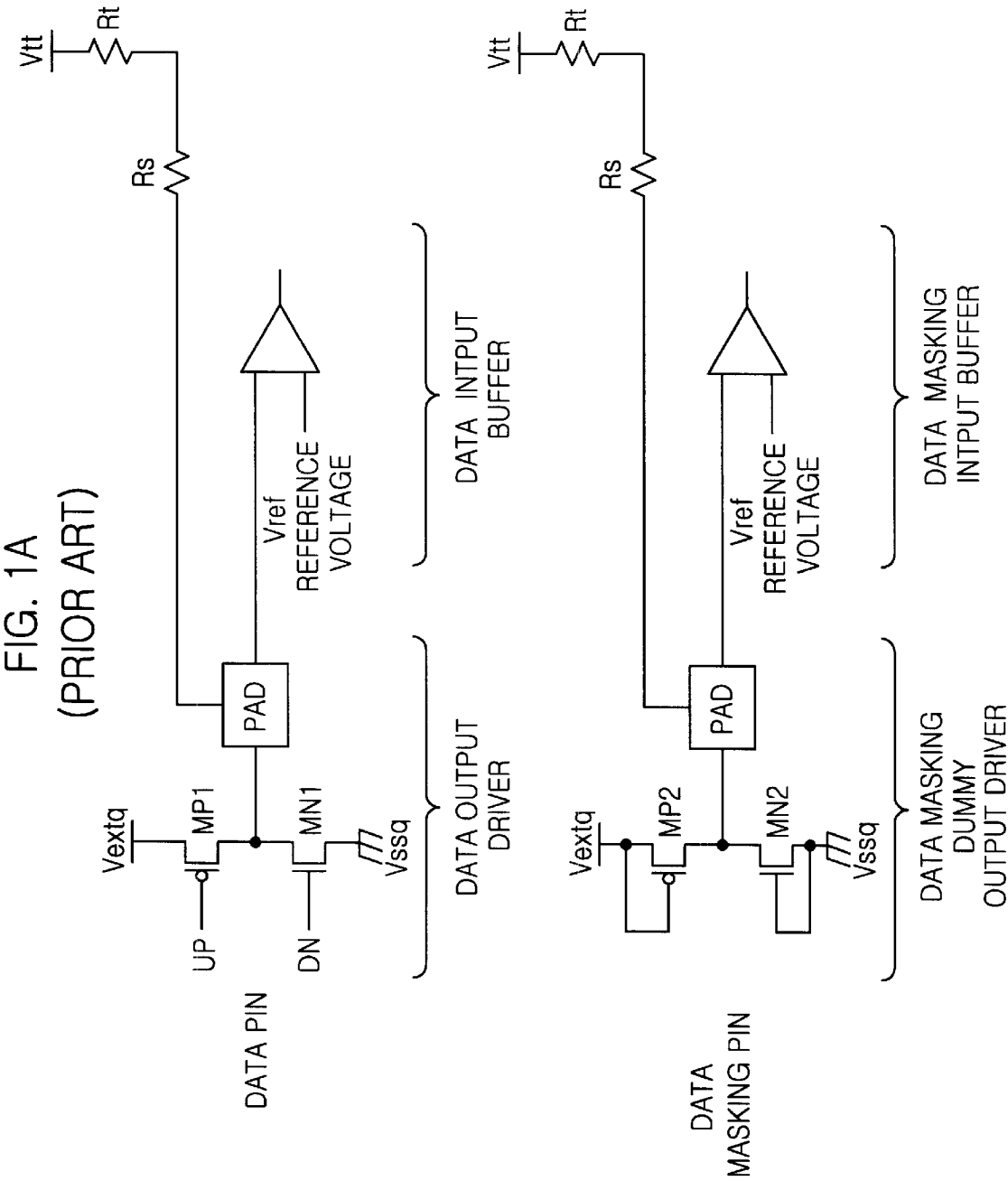
FIG. 1A provides a schematic diagram of a conventional tri-state CMOS output driver.
Figure 1B:
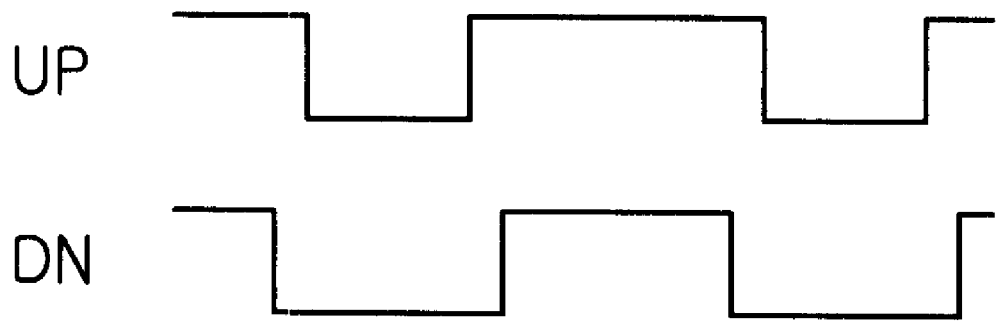
FIG. 1B shows a waveform of internal signals of the conventional output driver.
Figure 2A:
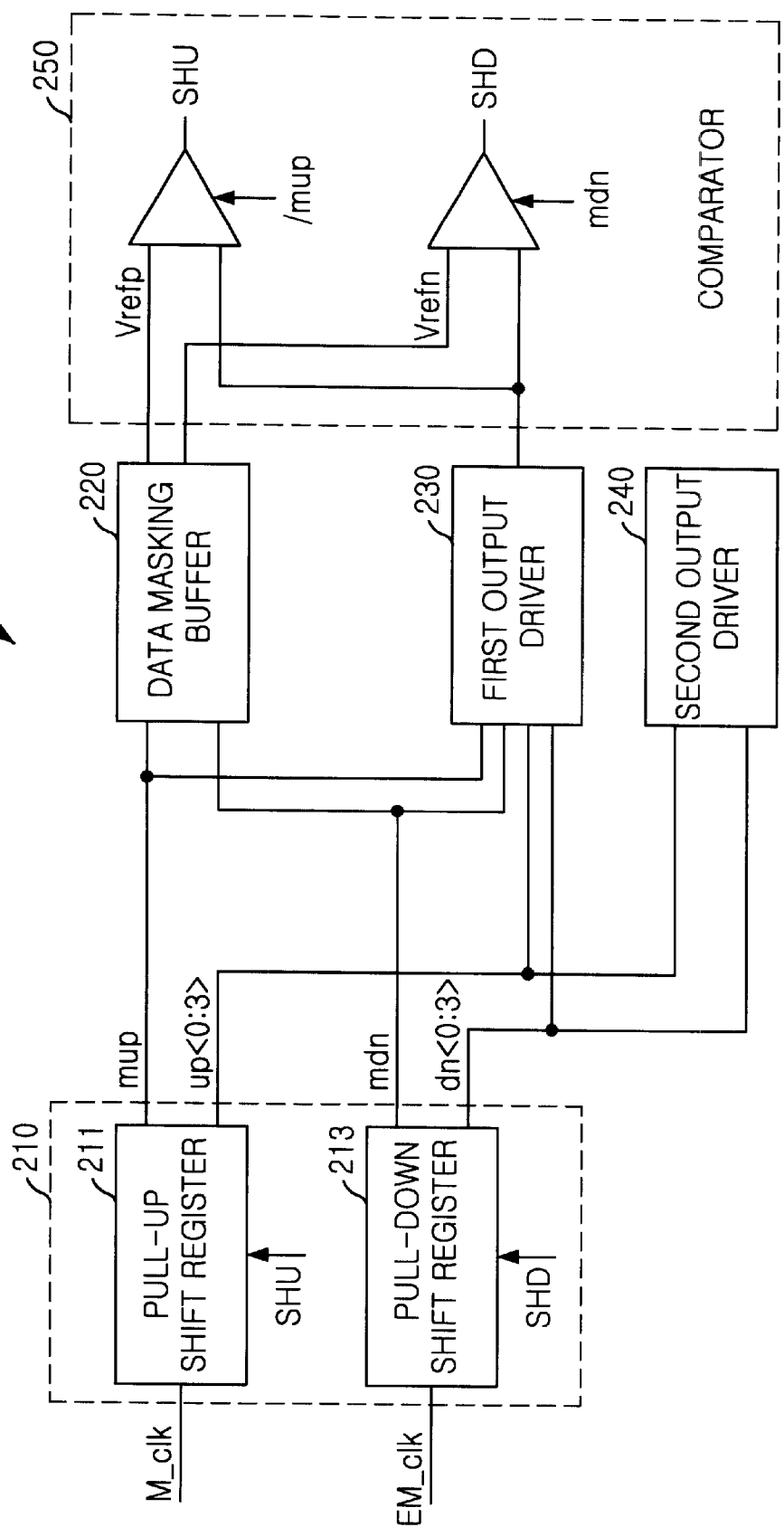
FIG. 2A is a block diagram of an adaptive output driver in accordance with the present invention.

Referring to FIG. 2A, there is provided a block diagram of a semiconductor memory device employing an adaptive output driver 200 in accordance with the present invention.

The adaptive output driver 200 includes a shift register unit 210 for generating control signals to control a pull-up transistor group and a pull-down transistor group in the adaptive output driver, a data masking buffer 220 for producing a reference voltage to be compared with the voltage level of the output driver and a first output driver 230 for changing the number of pull-down and pull-up transistors to be turned-on in the pull-up transistor group and the pull-down transistor group in response to the control signals provided from the shift register unit 210. It also includes a comparator 250 for producing signals which determine whether or not to perform a shifting process at the shift register unit 210 by comparing the voltage level of the output driver which varies according to the number of turned-on pull-up and pull-down transistors with the reference voltage generated at the data masking buffer 220.

In the meantime, in accordance with the present invention, the adaptive output driver uses one of output drivers in the semiconductor memory device, which is the first output driver 230 shown in FIG. 2A, and the rest of the output drivers are controlled by the shift signals outputted from the shift register unit 210. That is, the rest of output drivers become the second output driver 240.

In accordance with the present invention, reference voltages Vrefn and Vrefp used at the comparator 250 are produced by reducing the voltage variation due to changes in temperature, manufacturing processes and voltage and are compared to an output voltage of one output driver of data pins at the output terminal. The reduction in voltage variation is achieved by modifying the dummy output driver which has a diode form in the data masking pin. Differential amplifiers are used for this voltage comparison and there are used mup and mdn signals related to output signals of the pull-up shift register 211 and the pull-down shift register 213 as enable signals of the comparator 250.

SHU and SHD signals outputted from the comparator 250 are stored in the pull-up shift register 211 and the pull-down shift register 213, respectively. Then, the SHU and SHD signals are provided to the first output driver 230 to be compared with the reference voltages Vrefn and Vrefp, respectively.

An input signal M_clk initializing the pull-up shift register 211 of the shift register unit 210 is made by being synchronized to an external clock when a mode register set (MRS) is involved in a power sequence.

On the other hand, an input signal EM_clk initializing the pull-down shift register 213 is produced by being synchronized to the external clock when an extended mode register set (EMRS) is involved in the power sequence.

An mup signal and an mdn signal which determine an enable time of the shift registers 211 and 213 are enabled by the M_clk and the EM_clk signals, respectively; they are disabled without further performing the comparison process if the SHU and the SHD signals are determined to have an 'H' state.

A comparison process is performed as follows. All transistors of the output driver to be compared are turned-on in the initial stage and an output voltage level is compared to the reference voltage Vrefn (or Vrefp). For instance, in a pull-down comparative operation, when the output voltage level of the output driver is lower than the reference voltage Vrefn, the pull-down shift register 213 performs one right shift to thereby turn off one transistor and reduce the number of turned-on transistors, resulting in reducing the amount of current flowing through the output driver and decreasing the strength of the output driver. In a next comparative operation, if the voltage level of the output driver becomes higher than the reference voltage Vrefn, the pull-down shift register 213 is latched without performing the shifting process.

On the other hand, in a pull-up comparative operation, in case that the output voltage level of the output driver is higher than the reference voltage Vrefp, the pull-up shift register 211 performs one right shift to thereby turn off one transistor and reduce the number of turned-on transistors, resulting in reducing the amount of current flowing through the output driver and decreasing the strength of the output driver. In a next comparative operation, if the voltage level of the output driver becomes lower than the reference voltage Vrefp, the pull-up shift register 213 is latched without performing the shifting process.

As described above, the values stored in the shift registers determine the strength of the output driver in a normal operation.

Figure 2B:
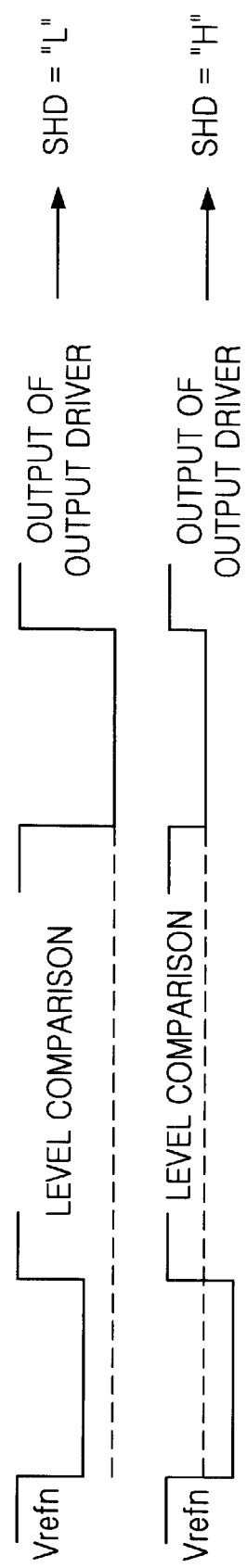
FIG. 2B is a view showing a comparison operation of a comparator shown in FIG. 2A.

Referring to FIG. 2B, an output signal SHD of the comparator 250 is determined by comparing the reference voltage Vrefn with the output voltage of the first output driver.

Figure 3:
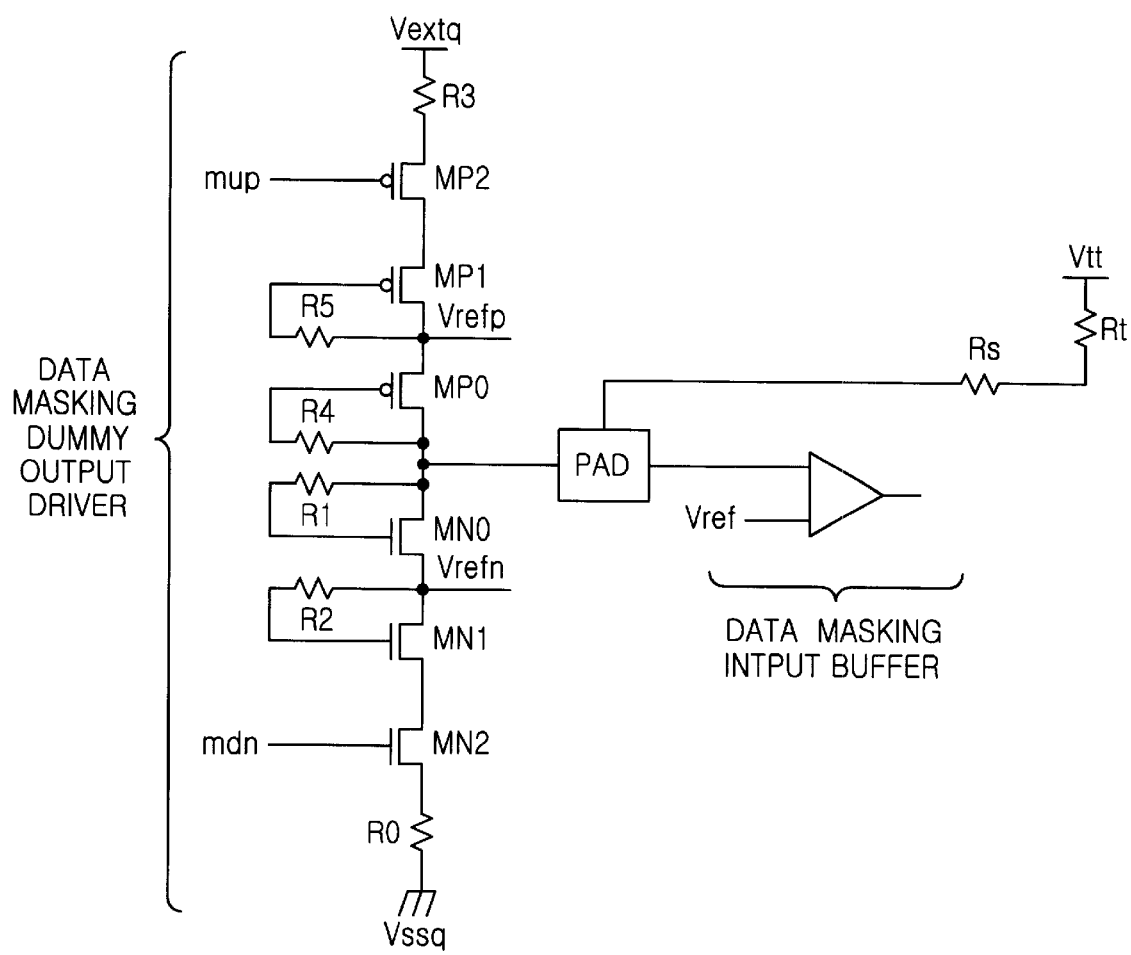
FIG. 3 describes a modified schematic diagram of a dummy output driver in a data masking pin in accordance with the present invention.

FIG. 3 depicts a modified schematic diagram of the dummy output driver in the data masking pin in accordance with the present invention.

At first, a set consisting of an n+ resistor and a transistor is connected to the termination voltage Vtt, resulting in the reduction of temperature variation. In general, the temperature coefficient of the n+ resistor is 2000 ppm/° C. (herein, ppm/° C. represents parts per million per degree) and that of the transistor is −3000 ppm/° C. Thus, locating the n+ resistor between a gate and a drain of the transistor compensates the temperature variation. In order to satisfy the above requirement, there are provided sets consisting of an NMOS transistor MN0 and a resistor R1, an NMOS transistor MN1 and a resistor R2, a PMOS transistor MP0 and a resistor R4, and a PMOS transistor MP1 and a resistor R5. A resistor R0 connected to the ground voltage Vssq and a resistor R3 attached to the external voltage Vextq are included to reduce variation according to the gate voltage of an NMOS transistor MN2 and a PMOS transistor MP2. The reference voltage Vrefn is generated from the source of the NMOS transistor MN0 and the reference voltage Vrefp is produced from the source of the PMOS transistor MP0. At this time, the mdn and the mup signals inputted to the gates of the NMOS transistor MN2 and the PMOS transistor MP2, respectively, have a "L" state and a "H" state in a normal operation and, therefore, the NMOS transistor MN2 and the PMOS transistor MP2 each operate like a diode.

Figure 4:
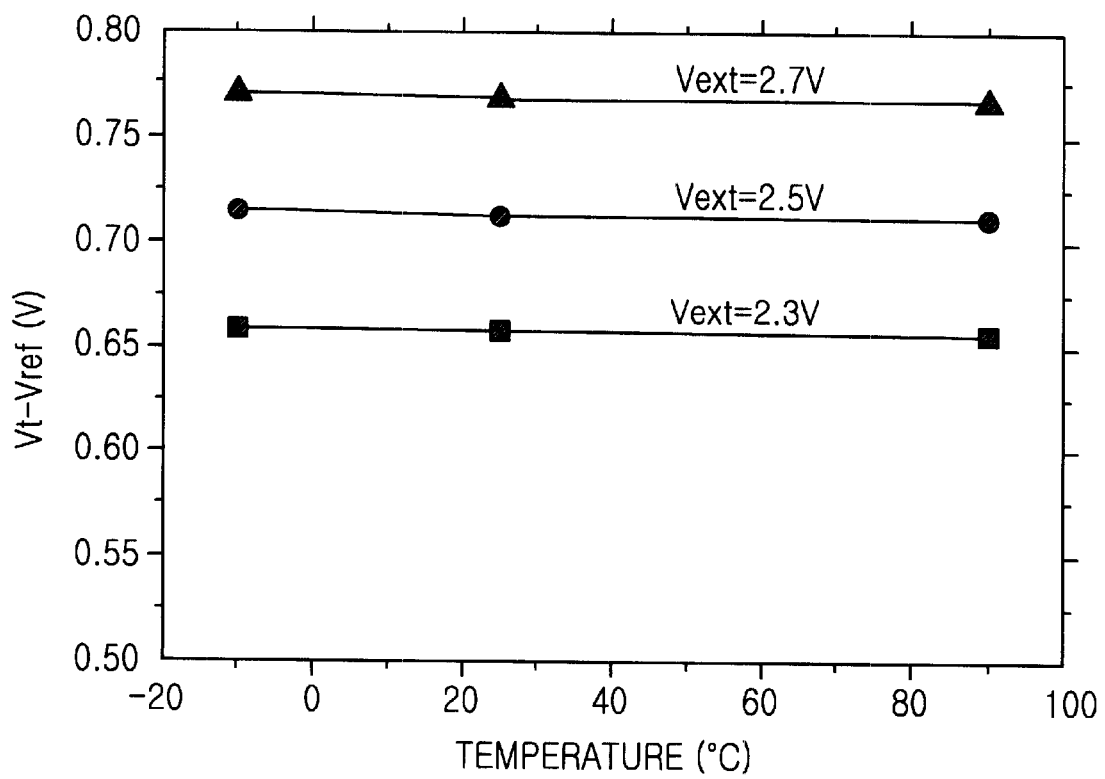
FIG. 4 provides the simulation results for variation according to temperature and voltage of Vrefn and Vtt shown in FIG. 3.

FIG. 4 is a simulation result for varying the temperature and the voltage of the reference voltage Vrefn and the termination voltage Vtt in FIG. 3.

According to the simulation results, the reference voltage Vrefn shows variation lower than 2 mV for the temperature variation from −10° C. to 90° C. Meanwhile, when the external voltage Vext changes from 2.3 V to 2.7 V, the reference voltage Vrefn shows 100 mV for the termination voltage Vtt.

Figure 5:
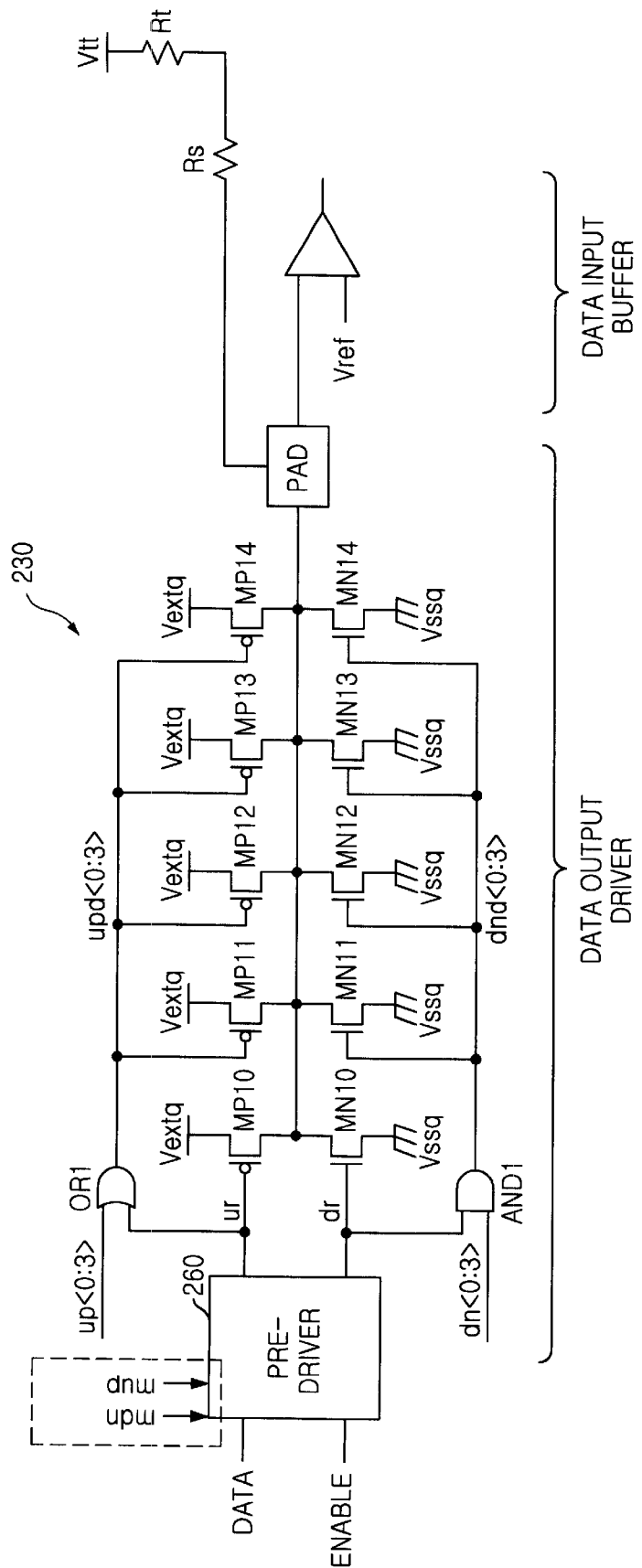
FIG. 5 represents a schematic diagram of a first output driver in accordance with an embodiment of the present invention.

FIG. 5 represents a schematic diagram of the first output driver 230 in accordance with an embodiment of the present invention, which shows an output driver of one data pin selected for a DC comparison.

The first output driver 230 is a tri-state output driver used in a data pin which receives a dn<0:3> signal and an up<0:3> signal provided from the pull-down shift register 213 and the pull-up shift register 211, respectively. The dn<0:3> signal and a dr signal generated from a pre-driver 260 are inputted to an AND gate AND1 and the up<0:3> signal and an ur signal produced from the pre-driver 260 are inputted to an OR gate OR1. The dn<0:3> signal is converted to a dnd<0:3> signal after being delayed by the AND gate AND1 and the up<0:3> signal is converted to an upd<0:3> signal after passing through the OR gate OR1.

From above, the reason why the dr signal and the ur signal are inputted to the AND gate AND1 and the OR gate OR1, respectively, is to control transistors other than an NMOS transistor MN10 and a PMOS transistor MP10 in the normal operation. The NMOS transistor MN10 and the PMOS transistor MP10 each has a default size and the dnd<0:3> signal and the upd<0:3> signals are sequentially inputted to gates of NMOS transistors MN11, MN12, MN13 and MN14 and PMOS transistors MP11, MP12, MP13 and MP14, respectively. The pre-driver 260 is provided with data and an enable signal produced by a read command.

Meanwhile, the pre-driver 260 of the first output driver 230 is controlled by the mdn signal and the mup signal, which is required to make the pre-driver turned-on with desired timing in a power-up sequence.

Figure 6:
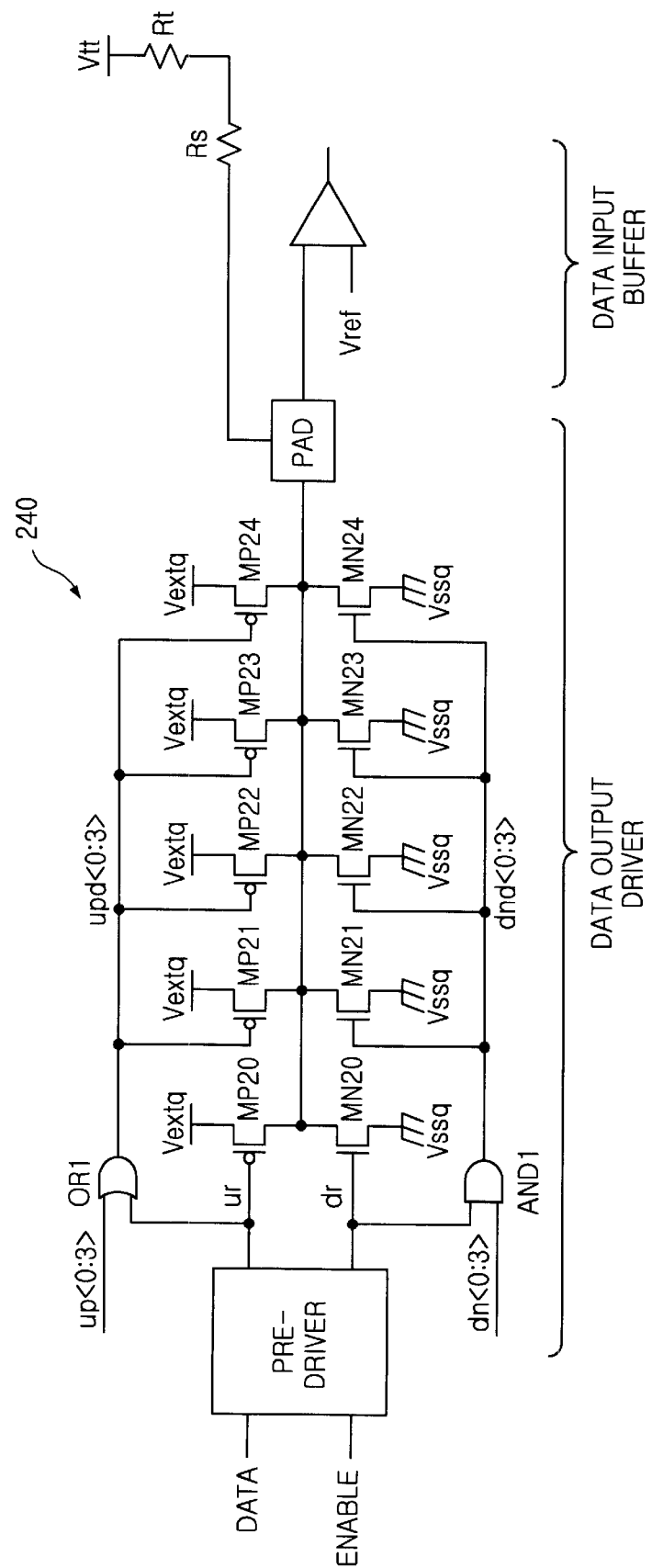
FIG. 6 illustrates a schematic diagram of a second output driver in accordance with an embodiment of the present invention.

Referring to FIG. 6, there is illustrated a schematic diagram of the second output driver 240 in accordance with an embodiment of the present invention.

The configuration of the second output driver 240 is almost the same as that of the first output driver 230 in FIG. 5. However, the second output driver 240 is not controlled by the mdn signal and the mup signal since all of the other output drivers are controlled in the same manner as the first output driver 230.

Figure 7:
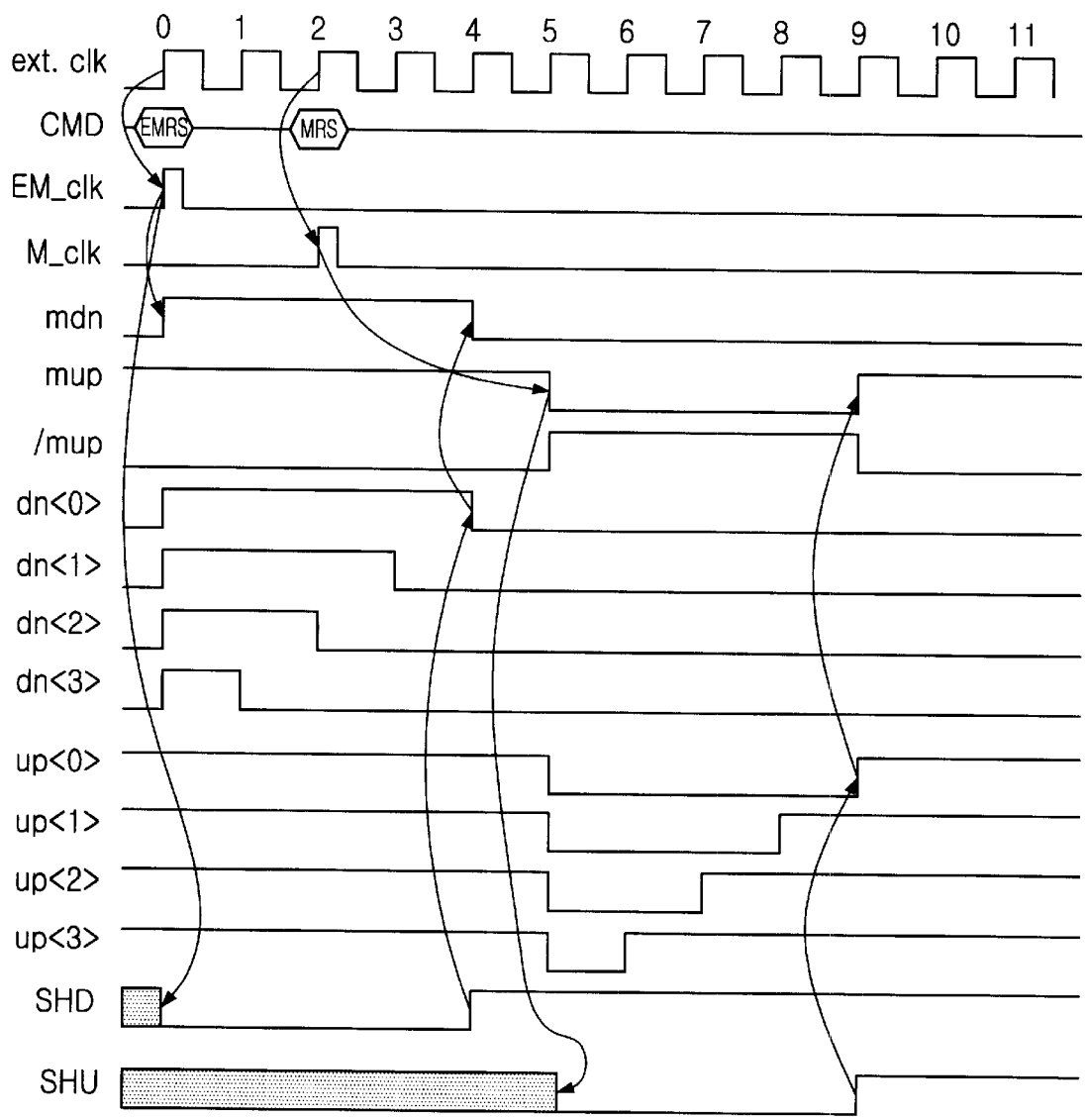
FIG. 7 shows a timing diagram of internal signals in accordance with the present invention.

In FIG. 7, there is shown a timing diagram of internal signals in accordance with the present invention.

The operations of the pull-up shift register 211 and the pull-down shift register 213 in the shift register unit 210 are initiated by the M_clk signal and the EM_clk signal, respectively. The dn<0:3> signal is initially set to an "L" state and, then, enabled to an "H" state when the EM_clk signal is inputted. After that, by being fed back the comparison results outputted from the pull-down shift register 213 in the shift register unit 210, the shift process is sequentially performed from a dn<3> signal.

The shift operation of the pull-down shift register 213 in the shift register unit 210 is determined by the SHD signal outputted from the comparator 250. If the SHD signal transitions from an "L" state to an "H" state, the shift operation is stopped, the current state of the register is latched and the comparator 250 is disabled. That is to say, if the reference voltage Vrefn is lower than the voltage level of the output driver, the shift operation is performed. On the other hand, if the reference voltage Vrefn becomes higher than the voltage level of the output driver, the shift operation is no longer performed and the current state of the register is latched.

Further, the shift operation of the pull-up shift register 211 in the shift register 210 is decided by the SHU signal outputted from the comparator 250. The up<0:3> signal is initially set to an "H" state and, then, transitions to an "L" state when the mup signal is converted to an "L" state once the M_clk signal is inputted, so that the NMOS transistors MN10, MN11, MN12, MN13, MN14, MN20 are enabled. After that, by being fed back the comparison results outputted from the pull-up shift register 211 in the shift register unit 210, the shift process is sequentially performed from an up<3> signal.

The shift operation of the pull-up shift register 211 is determined by the SHU signal generated from the comparator 250. If the SHU signal transitions from an "H" state to an "L" state, the shift operation is stopped, the current state of the register is latched and the comparator 250 is disabled. Namely, if the reference voltage Vrefp is higher than the voltage level of the output driver, the shift operation is performed. On the other hand, if the reference voltage Vrefp is lower than the voltage level of the output driver, the shift operation is no longer performed and the comparator 250 is disabled while the current state of the register is latched.

As shown in the above embodiment, the transistors are divided into four segments according to the upd<0:3> signal and the dnd<0:3> signal in FIGS. 5 and 6. In addition to this division, the transistors can be divided into N segments. The division number is determined by the resolution of the reference voltages Vrefn and Vrefp at the DM buffer 220 according to the voltage variation.

By way of precaution against the variation in manufacturing processes, the NMOS transistors MN0 and MN1 and the PMOS transistors MP0 and MP1 of the modified dummy output driver in the DM pin described in FIG. 3 can be designed to be trimmed by a metal.

As illustrated above, in accordance with the present invention, the size of the output driver can be adjusted according to the variation in temperature and voltage, so that the current resolution which depends on the voltage becomes adjustable and the DC characteristics of the output driver are also ameliorated since IBIS and IOH/IOL characteristics are improved. Moreover, by adopting the inventive configuration, the AC characteristics of the output driver, such as signal integrity, are improved. It is possible to control the slew rate so that a desired margin to specification can be obtained. Also, SSO (simultaneous switching output) noises are reduced since the current flowing through the output driver is controllable.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device with an adaptive output driver, comprising:
    a control means for producing a control signal so as to control a voltage level of the adaptive output driver;
    data masking buffering means for generating a reference voltage to be compared with the voltage level of the adaptive output driver;
    the adaptive output driver whose strength varies in response to the control signal provided from the control means; and
    comparison means for comparing the reference voltage with the voltage level of the adaptive output driver to thereby generate a signal determining whether or not the control means should perform a shift operation.

2. The semiconductor memory device as recited in claim 1, wherein the control means includes shift register means for producing the control signal by shifting input signals.

3. The semiconductor memory device as recited in claim 2, wherein the adaptive output driver includes:
    a plurality of pull-up transistors for pull-up driving an output terminal of the semiconductor memory device in response to the control signal of the shift register means and a control signal of a pre-driver; and
    a plurality of pull-down transistors, connected to the plurality of pull-up transistors in parallel, for pull-down driving the output terminal in response to the control signal of the shift register means and the control signal of the pre-driver.

4. The semiconductor memory device as recited in claim 3, wherein the plurality of pull-up transistors consist of 4 PMOS transistors which are turned-on or turned-off in response to the control signal of the shift register means.

5. The semiconductor memory device as recited in claim 4, wherein among the 4 PMOS transistors, the number of transistors to be turned-off increases depending on the comparison result of the comparison means.

6. The semiconductor memory device as recited in claim 3, wherein the plurality of pull-down transistors consist of 4 NMOS transistors which are turned-on or turned-off in response to the control signal of the shift register means.

7. The semiconductor memory device as recited in claim 6, wherein among the 4 NMOS transistors, the number of transistors to be turned-off increases depending on the comparison result of the comparison means.

8. The semiconductor memory device as recited in claim 3, wherein the shift register means includes:
    a pull-up shift register for receiving the signal generated from the comparison means to thereby produce a control signal controlling the plurality of pull-up transistors; and
    a pull-down shift register for receiving the signal produced from the comparison means to thereby generate a control signal controlling the plurality of pull-down transistors.

9. The semiconductor memory device as recited in claim 2, wherein the data masking buffering means includes a PMOS transistor group consisting of a plurality of PMOS transistors connected in series and an NMOS transistor group consisting of a multiplicity of NMOS transistors connected in series, wherein the PMOS transistor group and the NMOS transistor group are attached to each other serially, vertically and symmetrically and a node connecting the PMOS transistor group and the NMOS transistor group is attached to a termination voltage Vtt node.

10. The semiconductor memory device as recited in claim 9, wherein the PMOS transistor group and the NMOS transistor group contain 3 PMOS transistors and 3 NMOS transistors, respectively.

11. The semiconductor memory device as recited in claim 9, wherein among the PMOS transistor group, a resistor is connected between a gate and a drain of some PMOS transistors and among the NMOS transistor group, a resistor is attached between a gate and a drain of some NMOS transistors.

* * * * *